United States Patent [19]
Wong et al.

[11] Patent Number: 6,163,502
[45] Date of Patent: Dec. 19, 2000

[54] CLOCKING TO SUPPORT INTERFACE OF MEMORY CONTROLLER TO EXTERNAL SRAM

[75] Inventors: Jacques Wong, Santa Clara, Calif.; Beng Chew Khou; Leok Saw Chua, both of Singapore, Singapore

[73] Assignee: Advanced Micro Devices, Inc., Sunnyvale, Calif.

[21] Appl. No.: 09/527,622

[22] Filed: Mar. 17, 2000

Related U.S. Application Data

[60] Provisional application No. 60/171,301, Dec. 21, 1999.

[51] Int. Cl.$^7$ ........................................ G11C 8/00
[52] U.S. Cl. .............................. 365/233; 365/154
[58] Field of Search ...................... 365/233, 154, 365/156

[56] References Cited

U.S. PATENT DOCUMENTS 5,687,134  11/1997  Sugawara et al. ...................... 365/233
6,034,901   3/2000  Toda ................................... 365/233 X

*Primary Examiner*—Huan Hoang

[57] ABSTRACT

A network interface device is provided with a memory controller to control data writing and reading to and from an external synchronous SRAM. An interface to the SRAM has a clock pad responsive to an internal clock signal to produce a SRAM clock sent to the SRAM as a reference clock to support access to the SRAM. The clock pad contains an inverter for inverting the internal clock signal so as to produce the SRAM clock in response to the inverted internal clock signal. As a result, read time allocated for reading data from the SRAM to the memory controller is made longer than a cycle of the internal clock signal.

12 Claims, 5 Drawing Sheets

(background)

*(background)*

CLOCKING TO SUPPORT INTERFACE OF MEMORY CONTROLLER TO EXTERNAL SRAM

This patent application claims priority of U.S. provisional patent application No. 60/171,301 entitled "Clocking to Support Interface of Memory Controller to External SRAM", filed on Dec. 21, 1999.

FIELD OF THE INVENTION

The present invention relates to data processing, and more particularly, to a method of generating a reference clock to support an interface of a memory controller to an external SRAM.

BACKGROUND ART

FIG. 1 illustrates an interface of a chip 2 that incorporates a memory controller, to an external synchronous pipelined SRAM 4. An internal clock generated by the chip 2 is supplied to a clock output pad 6 that produces a SRAM clock sent to the SRAM 4 as a reference clock for supporting an interface to the SRAM 4.

As illustrated in FIG. 2, the SRAM clock driven by the chip 2 is always delayed with respect to the internal clock due to delays introduced by the clock pad 6 and the associated circuitry. Read time allocated for reading data from the SRAM 4 to the reading circuitry of the chip 2 is defined by a period between the leading or rising edge of the SRAM clock and the leading or rising edge of the next internal clock. Thus, as a result of the delay of the SRAM clock with respect to the internal clock, the read time becomes less than the internal clock cycle T. This problem is aggravated when the memory controller is running at higher frequencies.

Accordingly, it would be desirable to provide a clocking mechanism that would allow the read time to be increased.

DISCLOSURE OF THE INVENTION

The present invention offers a novel method of generating a memory clock signal to be supplied to an external memory to support an interface to the external memory. The method involves producing an internal clock signal, inverting the internal clock signal, and producing the memory clock signal based on the inverted internal clock signal so as to make read time allocated for reading data from the external memory longer than a cycle of the internal clock signal.

In a preferred embodiment of the invention, the external memory comprises a synchronous random access memory.

In accordance with one aspect of the invention, the system for providing interface to an external memory comprises a clock generator for producing an internal clock signal, and a clock pad responsive to the internal clock signal for producing a memory clock signal to be supplied to the external memory. The clock pad includes an inverting circuit for inverting the internal clock signal before producing the memory clock signal so as to make read time allocated for reading data from the external memory longer than a cycle of the internal clock signal.

Also, the system may comprise a data pad including an input data buffer for reading data from the external memory, arid an output data buffer for writing data to the external memory.

In accordance with another aspect of the invention, a network interface device for providing an interface between a data network and a computer system, comprises a memory controller for controlling writing and reading data to and from an external memory, a clock generator for producing an internal clock signal, and a clock pad responsive to the internal clock signal for producing a memory clock signal to be supplied to the external memory. The clock pad includes an inverter for inverting the internal clock signal before producing the memory clock signal so as to make read time allocated for reading data from the external memory longer than a cycle of the internal clock signal.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MADE FOR CARRYING-OUT THE INVENTION

Although the invention has general applicability in the field of data processing, the best mode for practicing the invention is based in part on the realization of a network interface in a packet switched network, such as an Ethernet (IEEE 802.3) network.

Figure 3:
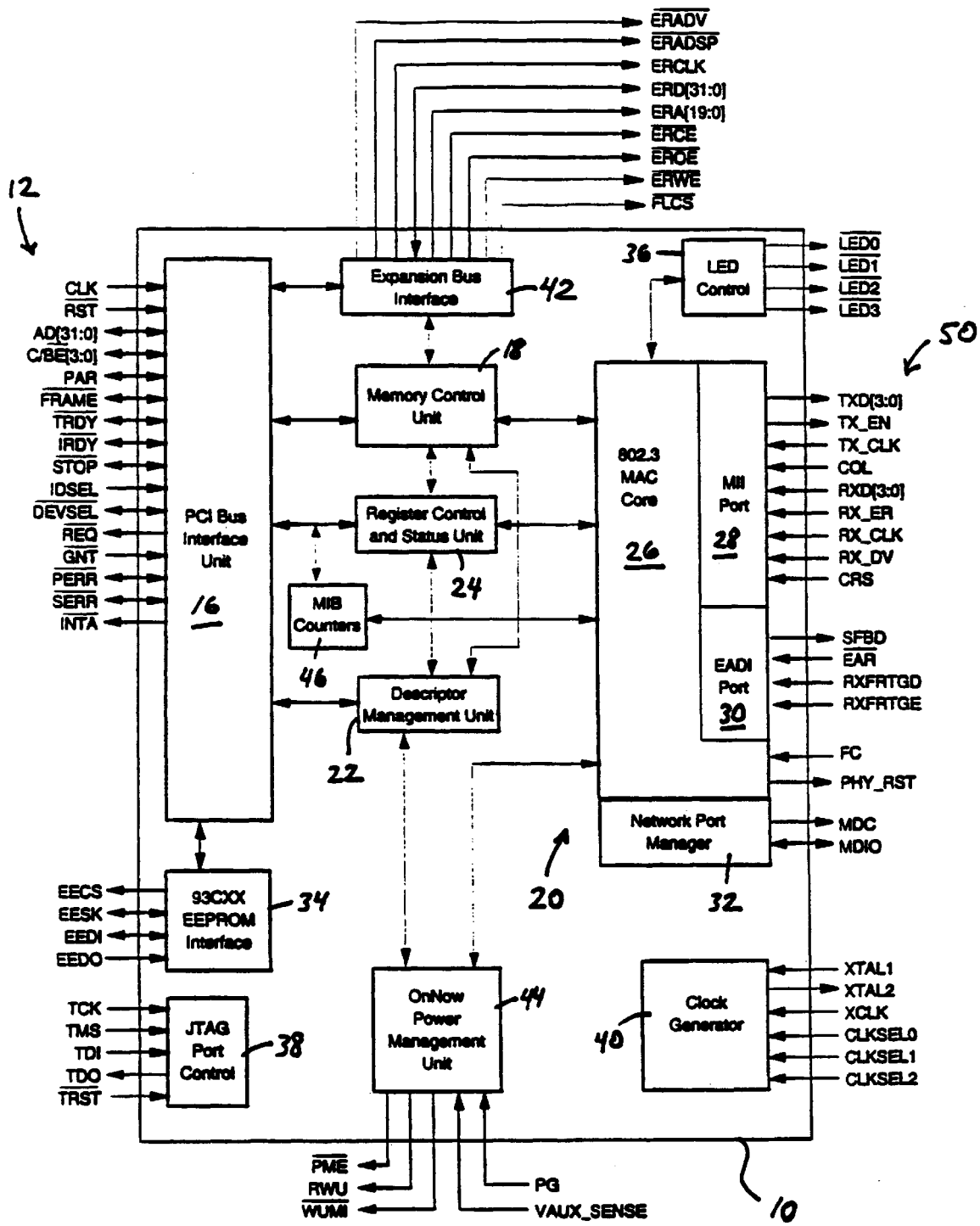
FIG. 3 is a block diagram of an exemplary network interface, in which the present invention may be implemented.

FIG. 3 is a block diagram of an exemplary network interface 10 that accesses the media of an Ethernet network according to an embodiment of the present invention.

The network interface 10, preferably a single-chip, 32-bit Ethernet controller, provides an interface between a local bus 12 of a computer system, for example, a peripheral component interconnect (PCI) local bus, and an Ethernet-based media 50. The reference numeral 50 identifies either an actual network medium, or alternately a signal path (e.g., a media independent interface (MII)) to a physical layer transceiver coupled to the network media. The computer system is controlled by a host CPU coupled to the bus 12.

The network interface 10 includes a PCI bus interface unit 16, a memory control unit 18, a network interface portion 20, a descriptor management unit 22 and a register control and status unit 24. The network interface portion 20 includes an IEEE 802.3 compliant and full-duplex capable media access control (MAC) core 26, a Media Independent Interface (MII) port 28 for connecting external 10 Mb/s, 100 Mb/s or 1000 Mb/s transceivers, an External Address Detection Interface (EADI) port 30, and a network port manager unit 32. The network interface 10 also includes an EEPROM interface 34 for reading from and writing to an external EEPROM, an LED control 36, an IEEE 1149.1-compliant JTAG Boundary Scan test access port interface 38, a clock generation unit 40, and an expansion bus interface 42. The expansion bus interface unit 42 interfaces to an external data memory (e.g., a synchronous pipelined SRAM) for frame storage and also to non-volatile (e.g., EPROM or Flash memory) storage for boot ROM use during startup.

The PCI bus interface unit 16, compliant with the PCI local bus specification (revision 2.2), receives data frames from a computer system memory, e.g. a host CPU's memory, via the PCI bus 12. The PCI bus interface unit 16, under the control of the descriptor management unit 22, receives transfers from the host computer via the PCI bus 12. For example, transmit data received from the PCI bus interface unit 16 is passed to the memory control unit 18, which stores it in the data memory. Subsequently, the memory control unit 18 retrieves the transmit data from the data memory and passes it to the MAC 26 for eventual transmission to the network. Similarly, receive data from the network 50 is processed by the MAC 26 and passed to the memory control unit 18 for storage in the data memory. Subsequently, the memory control unit 18 retrieves the receive data from the data memory and passes it to the PCI bus interface unit 16 for transfer to the host computer via the PCI bus 12.

The descriptor management unit 22 manages the transfers of data to and from the system memory via the PCI bus interface unit 16. Data structures contained in the system memory specify the size and location of data buffers along with various control and status information. The descriptor management unit 22 interfaces with the memory control unit 18 to insert control information into the transmit data stream and to retrieve status information from the receive data stream.

The network interface portion 20 includes a network port manager 32 that performs auto-negotiation functions by communicating via the media 50 with a corresponding auto-negotiation unit in the link partner (e.g., a centralized hub, repeater, workstation, or switch).

The network interface 10 also includes a power management unit 44 that enables remote activation (i.e., turn-on) of the host computer via the network medium 50 by detecting a predetermined pattern on the network medium 50 according to Microsoft OnNow and ACPI specifications, including compliance with Magic Packet technology and PCI Bus Power Management Interface Specification protocols.

The network interface 10 also includes a MIB counter unit 46 which accepts information from the MAC 26 regarding frame transmission and reception and maintains the statistics necessary for network management. These statistics are accessed by the host computer via the PCI bus interface unit 16.

Figure 4:
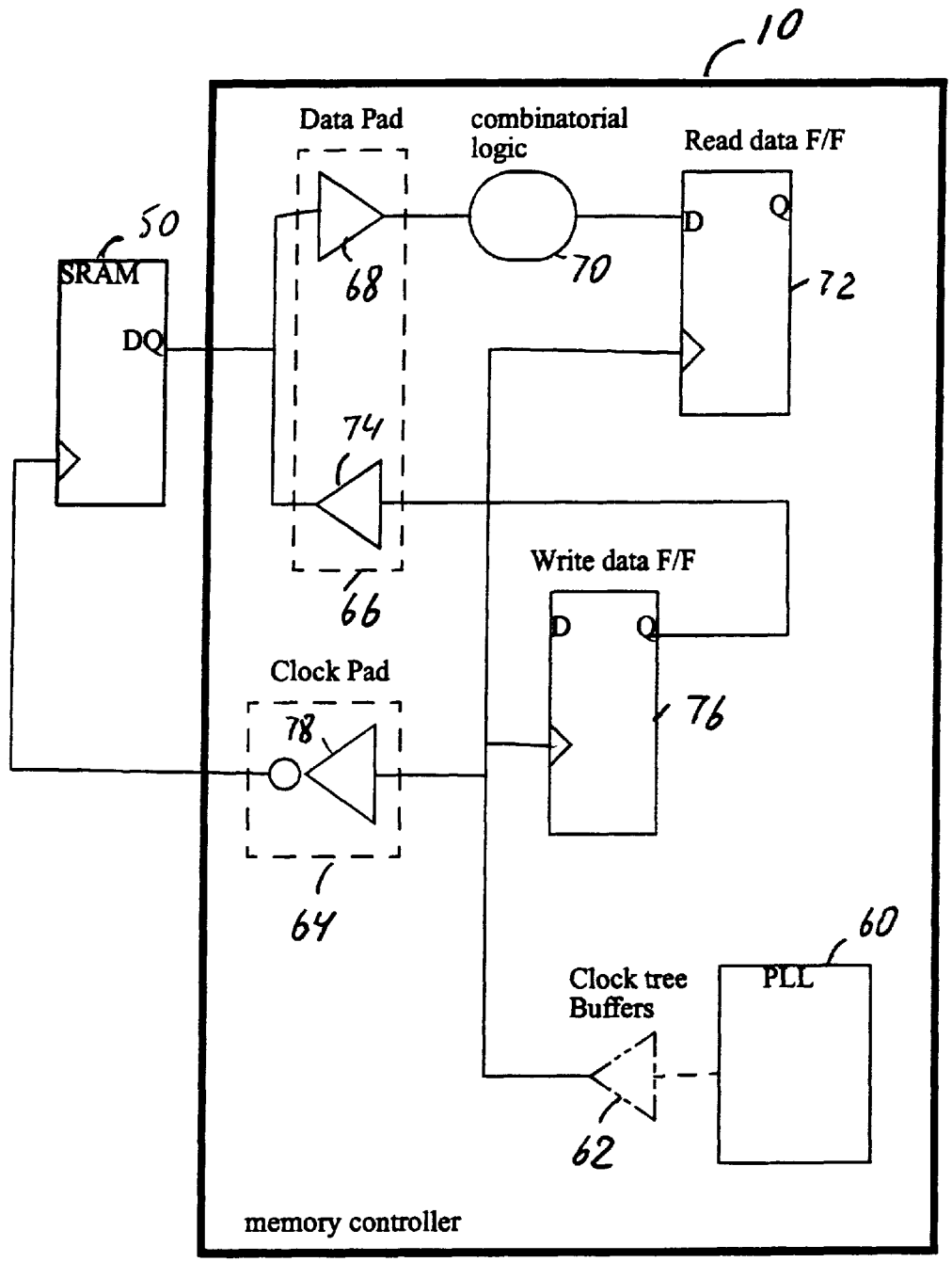
FIG. 4 is a simplified block diagram illustrating an interface to an external SRAM in accordance with the present invention.

As discussed above, the memory control unit 18 controls writing and reading data from the external data memory via the expansion bus interface 42. FIG. 4 is a simplified block diagram illustrating interface to the external data memory such as a synchronous pipelined SRAM 50 in accordance with the present invention.

Figure 5:
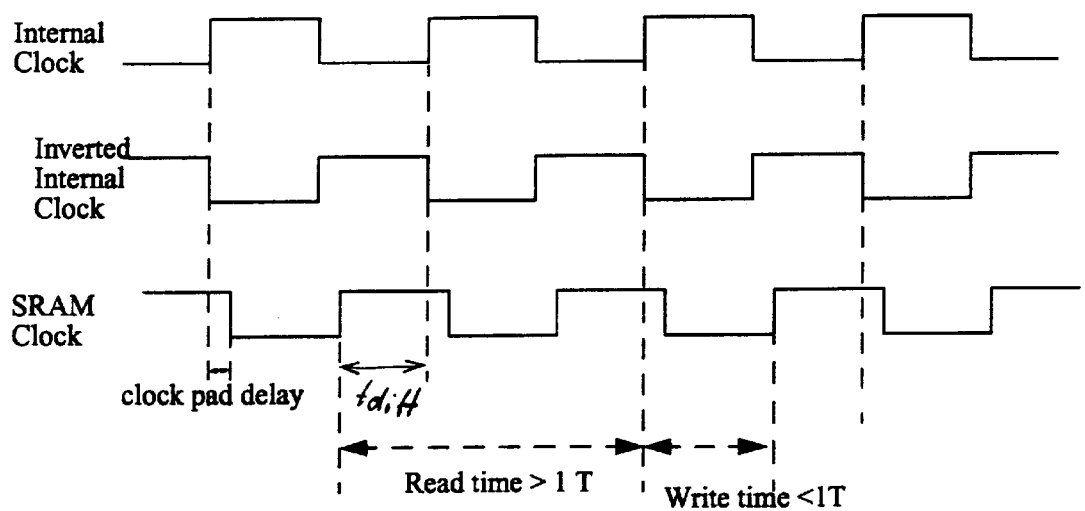
FIG. 5 shows timing diagrams illustrating clock signals in accordance with the present invention.

A phase lock loop (PLL) 60 and clock tree buffers 62 produce an internal clock signal illustrated in FIG. 5. For example, the PLL 60 and buffers 62 may be arranged in the clock generator 40. The internal clock signal is supplied to the clock pad 64 that produces a SRAM clock supplied to the SRAM 50 as a reference clock for supporting read and write access to the SRAM 50. As will be discussed below, the clock pad 64 inverts the internal clock signal. As a result, the SRAM clock is responsive to the inverted internal clock signal.

A data pad 66 is connected to the SRAM 50 to support data writing and reading. The data pad 66 may include an input data buffer 68 for supplying data read from the SRAM 50 to data reading circuitry represented in FIG. 4 by combinatorial logic 70 and a read data flip-flop 72. Also, the data pad 66 may include an output data buffer 74 that supplies the SRAM 50 with write data from data writing circuitry represented in FIG. 4 by a write data flip-flop 76. For example, the clock pad 64 and data pad 66 may be arranged in the expansion bus interface unit 42, the data reading and writing circuitry may be provided in the memory control unit 18.

Figure 1:
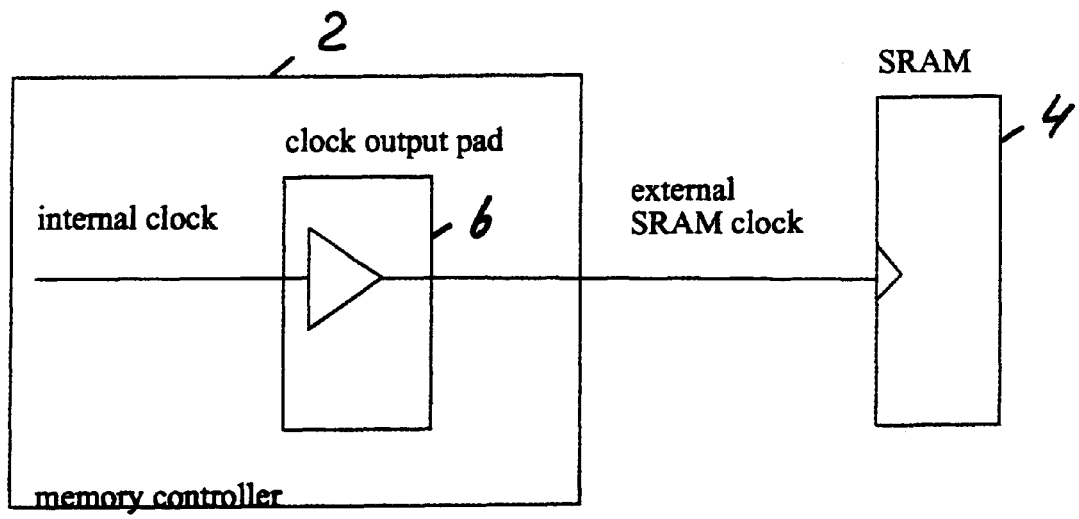
FIG. 1 is a diagram illustrating a conventional interface to an external SRAM.
Figure 2:
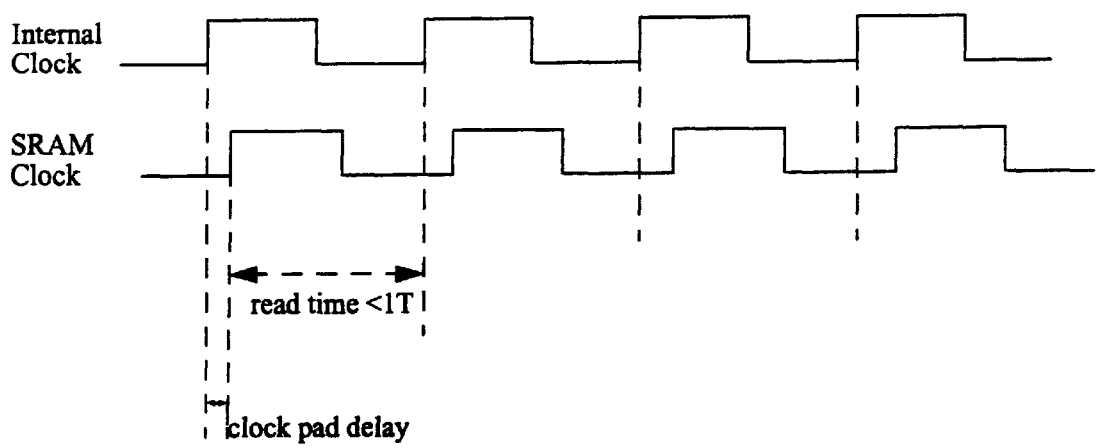
FIG. 2 shows timing diagrams illustrating an internal clock and an SRAM clock generated in a conventional system.

As discussed above and illustrated in FIG. 2, in a conventional interface to an external SRAM, the SRAM clock is always delayed with respect to the internal clock due to delays introduced by the clock pad and the associated circuitry. As a result, the read time allocated for reading data from the external SRAM is less than the internal clock cycle T.

The clocking pad of the present invention is configured to increase the read time. In particular, the clock pad 64 is provided with an inverter 78 that inverts the internal clock signal. The SRAM clock produced at the output of the clock pad 64 is responsive to the inverted internal clock signal.

FIG. 5 illustrates the inverted internal clock signal produced by the inverter 78 and the SRAM clock at the output of the clock pad 64. As a result of inverting the internal clock signal, the trailing or falling edge of the SRAM clock produced in response to the inverted clock signal is delayed with respect to the trailing or falling edge of the inverted clock signal by a delay time defined by the delay in the clock pad 64 and the accociated circuitry. However, the leading or rising edge of the SRAM clock leads the leading or rising edge of the internal clock by a time difference value $t_{diff}$. As a result, the read time allocated for reading data from the SRAM 50 is larger than the internal clock cycle T. In a preferred embodiment of the present invention, $T+t_{diff}$ is not less than $t_{read}$, where $t_{read}$ is read time.

In accordance with the present invention, write time $t_{write}$, allocated for writing data to the SRAM 50 is less than the internal clock cycle T. However, the timing requirement for writing data is less critical than the requirement for reading data. In the preferred embodiment of the invention, $T-t_{diff}$ is not less than $t_{write}$.

The time difference $t_{diff}$ between the internal clock and the SRAM clock may be calculated as ½ T−S, where S is the sum of the clock pad delay and the board load delay. The board load delay is delay contributed to the board trace wire on the card itself.

The $t_{read}$ may be calculated at the sum of the board load delay, the data input pad delay, the read data flip-flop delay due to the propagation of data to the Q output of the flip-flop after the rising edge of the clock occurs, the setup time required for the flip-flop, and the logic delay due to combinatorial logic between the data pad and the flip-flop latching the read data from the SRAM.

The $t_{write}$ time may be calculated as the sum of the board load delay, the data output pad delay, the write data flip-flop delay, and the setup time required for the SRAM.

Thus, the present invention allows the read time of the external SRAM 50 to be increased by inverting the internal clock signal before producing the SRAM clock supplied to the SRAM 50.

Those skilled in the art will recognize that the present invention admits of a number of modifications, within the spirit and scope of the inventive concepts. For example, the generation of the SRAM clock based on the inverted internal clock may be implemented in a number of different ways.

While the foregoing has described what are considered to be preferred embodiments of the invention it is understood that various modifications may be made therein and that the invention may be implemented in various forms and embodiments, and that it may be applied in numerous applications, only some of which have been described herein. It is intended by the following claims to claim all such modifications and variations which fall within the true scope of the invention.

What is claimed is:

1. A method of generating a memory clock signal to be supplied to an external memory to support an interface to the external memory, comprising the steps of:

producing an internal clock signal, inverting the internal clock signal, and producing the memory clock signal based on the inverted internal clock signal so as to make read time allocated for reading data from the external memory longer than a cycle of the internal clock signal.

2. The method of claim 1, wherein the external memory comprises a synchronous random access memory.

3. A system for providing interface to an external memory, comprising:

a clock generator for producing an internal clock signal, and a clock pad responsive to the internal clock signal for producing a memory clock signal to be supplied to the external memory, the clock pad including an inverting circuit for inverting the internal clock signal before producing the memory clock signal so as to make read time allocated for reading data from the external memory longer than a cycle of the internal clock signal.

4. The system of claim 3, wherein the external memory comprises a synchronous random access memory.

5. The system of claim 3, further comprising a data pad for supporting data transfer to and from the external memory.

6. The system of claim 5, wherein the data pad comprises an input data buffer for reading data from the external memory.

7. The system of claim 5, wherein the data pad comprises an output data buffer for writing data to the external memory.

8. A network interface device for providing an interface between a data network and a computer system, the network interface device comprising:

a memory controller for controlling writing and reading data to and from an external memory, a clock generator for producing an internal clock signal, and a clock pad responsive to the internal clock signal for producing a memory clock signal to be supplied to the external memory, the clock pad including an inverter for inverting the internal clock signal before producing the memory clock signal so as to make read time allocated for reading data from the external memory longer than a cycle of the internal clock signal.

9. The device of claim 8, wherein the external memory comprises a synchronous random access memory.

10. The device of claim 8, further comprising a data pad for supporting data transfer to and from the external memory.

11. The device of claim 10, wherein the data pad comprises an input data buffer for reading data from the external memory.

12. The system of claim 10, wherein the data pad comprises an output data buffer for writing data to the external memory.

* * * * *